United States Patent [19]

Hendricsen et al.

[11] Patent Number: 5,217,273
[45] Date of Patent: Jun. 8, 1993

[54] SERIAL PUMPING FOR PORTABLE HANDLING TOOL OF ELECTRONIC WORKPIECES

[75] Inventors: Howard W. Hendricsen, Los Altos; Quincy D. Allison, Boulder Creek, both of Calif.

[73] Assignee: H-Square Corporation, Sunnyvale, Calif.

[21] Appl. No.: 883,158

[22] Filed: May 14, 1992

[51] Int. Cl.$^5$ ............................................. B66C 1/02
[52] U.S. Cl. ................................. 294/64.1; 29/743; 29/758
[58] Field of Search ............................ 294/64.1–64.3; 29/743, 758; 417/205, 244; 901/40; 251/319, 321

[56] References Cited

U.S. PATENT DOCUMENTS

| | | | |
|---|---|---|---|
| 3,071,402 | 1/1963 | Lasto et al. | 294/64.1 |
| 3,335,727 | 8/1967 | Spoto | 294/64.1 X |
| 4,042,999 | 8/1977 | Triantafyllou | 294/64.1 X |
| 4,527,824 | 7/1985 | Rosenfeld | 294/64.1 |
| 4,744,594 | 5/1988 | Poli et al. | 294/64.1 |
| 4,767,142 | 8/1988 | Takahashi et al. | 294/64.1 |
| 4,822,278 | 4/1989 | Oliva et al. | 294/64.1 X |
| 4,887,941 | 12/1989 | Crinquette et al. | 417/2 |
| 4,905,370 | 3/1990 | Hineno et al. | 294/64.1 X |
| 5,002,464 | 3/1991 | Lee | 417/152 |
| 5,039,280 | 8/1991 | Saulgeot et al. | 417/205 |
| 5,042,521 | 8/1991 | Shiomi | 137/118 |

FOREIGN PATENT DOCUMENTS

| | | | |
|---|---|---|---|
| 1278287 | 12/1986 | U.S.S.R. | 294/64.1 |
| 2200615 | 9/1988 | United Kingdom | 294/64.1 |

*Primary Examiner*—David M. Mitchell
*Assistant Examiner*—Dean J. Kramer
*Attorney, Agent, or Firm*—Schneck & McHugh

[57] ABSTRACT

A battery-powered portable tool for handling electronic workpieces, such as semiconductor wafers, wherein a desired pressure differential is generated by a serial connection of vacuum pumps. The tool includes a number of features which minimize the generation of particulate matter. The pumps are sealed in an airtight chamber to prevent the release of particles created during operation of the pumps. The tool is exhausted directly to the ambient atmosphere to prevent pump exhaust from disturbing particles within the tool. The valve is designed to provide a quick release of even lightweight workpieces and to minimize the sliding of valve components against each other. Submicron filtering removes any particles from the pump exhaust.

14 Claims, 4 Drawing Sheets

SERIAL PUMPING FOR PORTABLE HANDLING TOOL OF ELECTRONIC WORKPIECES

TECHNICAL FIELD

The present invention relates generally to handling tools and more particularly to vacuum-actuated tools for handling electronic workpieces.

BACKGROUND ART

Both during and between processing steps fabricating integrated circuit chips, various devices are utilized to handle electronic workpieces. An "electronic workpiece" is defined as any article that is formed during steps of assembling an electrical device. Such articles include semiconductor wafers on which a number of integrated circuit chips are fabricated, the individual chips following dicing of a completed semiconductor wafer, and integrated circuit packages containing one or more chips for attachment to a printed circuit board. Handling tools include vacuum-actuated devices to which a wand tip is removably attached. Air is evacuated from the wand tip to provide a force for picking up workpieces that are brought into contact with the wand tip.

There are advantages to the use of portable vacuum-actuated handling tools, but various factors have made it difficult to manufacture a practical portable vacuum tool that meets the requirements of the electronic industry. These factors include: (1) cost considerations; (2) force requirements; (3) particle generation concerns; and (4) a need for rapid vacuum release. The first two factors are typically tradeoffs. Portable vacuum tools are available, wherein the tool is a two-piece member comprising a base having a vacuum pump and a wand handle having a valve and a wand tip. The base is connected to the wand handle by a hose. The vacuum pressure of such a tool is typically within the range of 5 to 15 inches of Hg. While the available vacuum pressure works adequately in many applications, it is well below the 21 to 26 inches of Hg that is available using in-house vacuum systems at wafer fabrication facilities. Increasing the vacuum capacity within a portable electronic workpiece handling tool has required use of a vacuum pump that is considered cost inefficient by many users.

Regarding particle generation, even minute particulate matter will contaminate a semiconductor wafer. Particulate contaminants on an active area of the wafer will lower the yield, and therefore raise the cost, of the manufacturing process. If the particulate contaminants are excessive, expensive and time consuming cleaning and inspection steps may have to be added to the process. Vacuum pumps in a portable handling tool include bushings which render the pump susceptible to particle generation. Consequently, great care must be taken in the design of vacuum tools for cleanroom operation. Fabrication facilities include in-house vacuum systems in which, unlike portable tools, the vacuum exhaust is released outside of the room in which electronic workpieces are located. For this reason, there is a tendency to use in-house systems and there is a reluctance to use portable handling tools.

The valve on a handling tool plays an important role in the operation of the tool. As noted above, the valve should provide a rapid release of an electronic workpiece. The most common valving mechanism is one in which a user presses a reciprocating button or lever to cause displacement of a valve stem having a cylindrical shape with a circular groove cut into the outside surface. Movement of the button or lever aligns the circular groove with an axial bore through the tool, thereby providing a flow path for evacuation from a wand tip connected to the tool. The cylindrical valve stem is dimensioned to block the axial bore when the circular groove is not aligned with the axial bore. One difficulty with this valving mechanism is that a reduced vacuum pressure remains even after misalignment of the circular groove. Therefore, the release of a lightweight electronic workpiece is slowed. Another difficulty is that such a valving mechanism requires adherence to close tolerances in order to ensure blockage of the axial bore. This often requires a sliding of one part against another, thereby creating another source of particulate contamination.

It is an object of the present invention to provide a generally nonparticulating portable vacuum tool for handling electronic workpieces, wherein the tool is cost-efficient and includes a quick-release mechanism.

SUMMARY OF THE INVENTION

The above object has been met by a portable battery-powered handling tool for electronic workpieces in which a pressure differential is created by a serial connection of first and second vacuum sources. Thus, the tool does not rely upon an expensive, high capacity single source pump arrangement. Particle generation is minimized by providing an airtight chamber for housing the serially connected vacuum sources, by exhausting the vacuum sources directly to the ambient atmosphere, by providing submicron filtering of the exhaust, and by utilizing a valve that does not require a tight sliding of a valve stem against surrounding structure.

Preferably, the tool is a single piece tool having the serially connected first and second vacuum pumps, the valve and a battery housed within a portable body on which a vacuum tip is removably mounted. That is, in a preferred embodiment the tool is a stand alone device. Air from the vacuum tip is evacuated through the valve and enters an inlet of the first vacuum pump. The outlet of the first vacuum pump is connected to the inlet of the second vacuum pump. The vacuum pumps are isolated in an airtight chamber so that the tool is not susceptible to the generation of particulate contaminants normally associated with pumps. Rather than exhausting into the body of the tool, the outlet of the second vacuum pump is filtered and exhausted into the ambient atmosphere. This prevents particles that were created during manufacture of the tool from being disturbed and vented into a fabrication cleanroom.

The valve includes a path to the atmosphere that is connected to the vacuum tip upon movement of the valve to a workpiece-release position. Consequently, no residue vacuum pressure is retained at the vacuum tip and a rapid release is achieved. Moreover, the vent to the ambient atmosphere is along the valve stem, so that the valve is not a type that requires a close sliding of the valve stem against surrounding structure.

In another embodiment, the vacuum pumps and the battery are housed within the portable body, so body acts as a base, and a hose connects wand member that includes the vacuum tip and the valve. In yet another embodiment, the base includes an attachment for selectively securing the base to the belt of a user.

An advantage of the present invention is that the attachment of the vacuum pumps provides a pressure differential generally equivalent to that of a conventional in-house system of a fabrication facility. The tools designed for attachment to the in-house system without exerting a pressure so great that workpiece breakage would occur. Another advantage is that the tool has been to minimize or eliminate particle generation, while allowing a user to conveniently relocate the tool as needed.

BEST MODE FOR CARRYING OUT THE INVENTION

Figure 1:
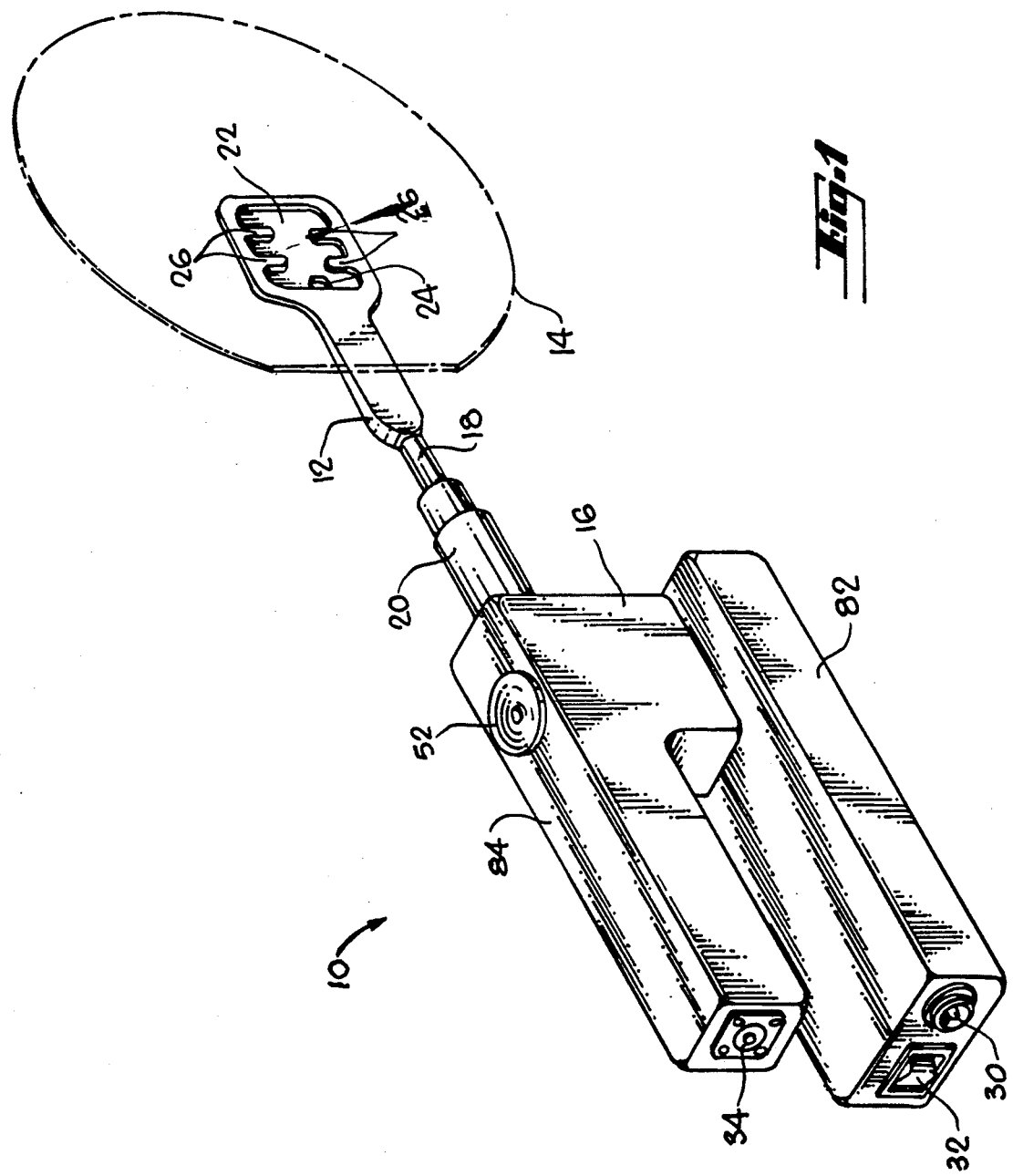
FIG. 1 is a perspective view of a first embodiment of a handling tool in accord with the present invention.

With reference to FIG. 1, a stand-alone handling tool 10 for electronic workpieces is shown as including a vacuum tip 12 for picking up a semiconductor wafer 14. The vacuum tip is demountably attached to a body 16 of the tool. Depending upon workpiece which is to be handled, a number of different vacuum tips can be used. The vacuum tip 12 includes a stem 18 that is press fit into a fitting 20 extending from the body. Alternatively, locking hardware may be used to secure the vacuum tip to the body.

The vacuum tip 12 is made of a material suitable for the desired application. Applications vary in terms of chemical atmosphere and temperature. The material should be nonparticulating. Polyetheretherketone (PEEK) is a suitable material in many applications. Air is evacuated from a chamber 22 via an opening 24 in a vacuum tip. In order to provide support that will limit any deformation of the semiconductor wafer, lands 26 extend toward the center of the chamber 22.

The body 16 of the tool 10 is configured for easy handling. A body having a width of 0.75 inch, a height of 1.0 inch and a length of 1.5 inches is contemplated, but larger tools are also available.

Figure 2:
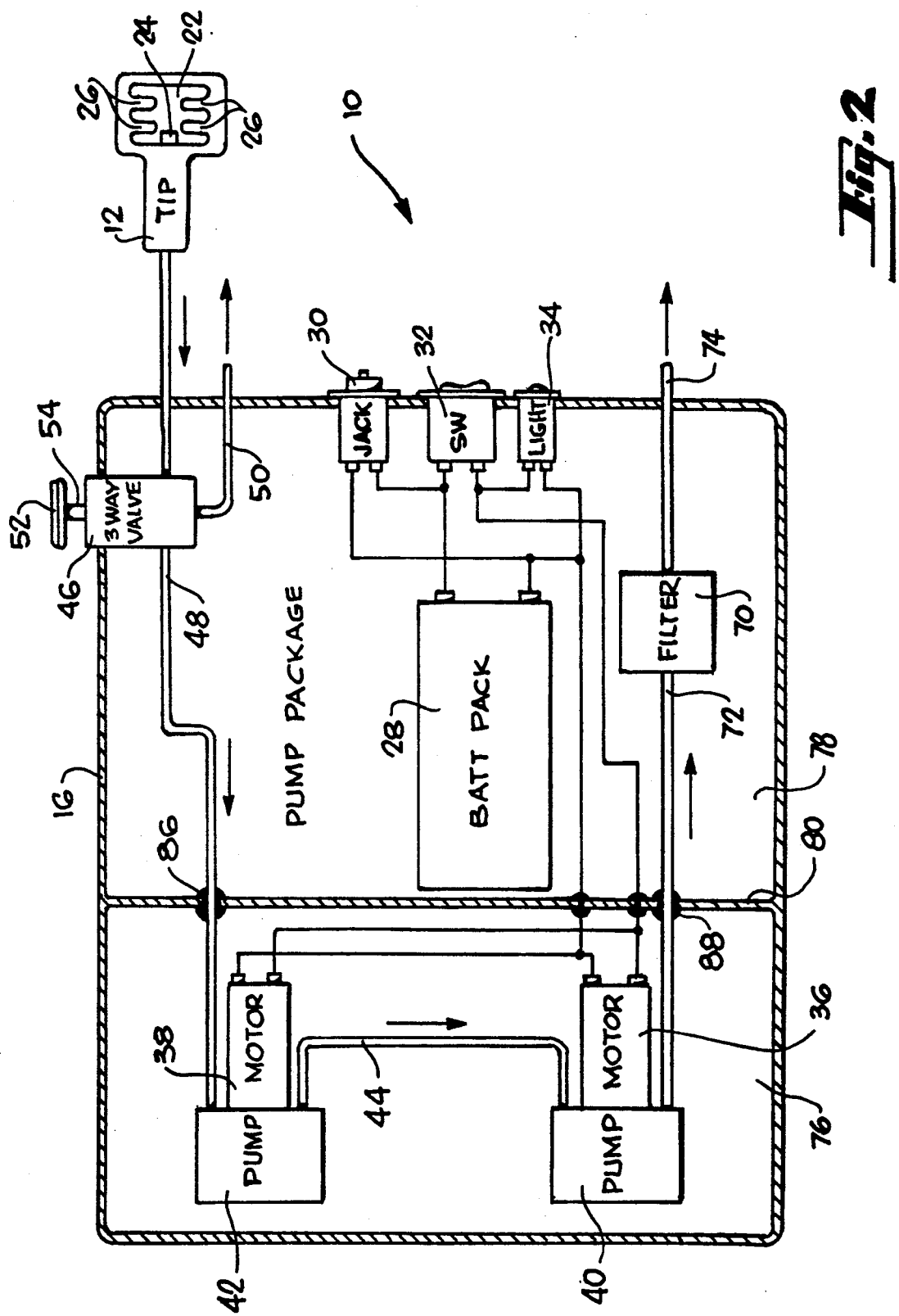
FIG. 2 is a schematic view of the tool of FIG. 1.

Referring now to FIGS. 1 and 2, the handling tool 10 is powered by a battery pack 28. A Ni-Cad rechargeable battery pack that provides a voltage of 7.2 V at 700 milliamp/hr may be used. An electrical jack 30 connects to a recharging unit, not shown.

A toggle switch 32 is utilized to energize a power lamp 34 and a pair of pump motors 36 and 38. Two pumps 40 and 42 are shown connected in serves with respect to evacuation of air from the vacuum tip 12. In order to achieve a greater vacuum pressure, more pumps may be connected in series. Preferably, the vacuum pressure is generally equivalent to that of an in-house system of a fabrication facility, i.e. 21 to 26 inches of Hg. Preferably, each pump is an oil-less diaphragm type device. An acceptable pump is manufactured by KNF Neuberger, which provides a single-pump vacuum pressure of approximately 16 inches of Hg. In connecting two such pumps in a parallel fashion, it was discovered that the rate of flow was increased significantly, but that the dead space of the vacuum chamber 22 created by contact of the tip 12 against the semiconductor wafer 14 did not achieve sufficient force for reliably securing the semiconductor wafer to the handling tool 10. It was also discovered that a serial connection of the pumps 40 and 42 by a hose 44 achieved the desired vacuum pressure.

The flow path from the vacuum tip 12 to the pumps 40 and 42 includes a three-way valve 46. The valve 16 selectively links the tip 12 either to the pumps via a hose 48 or to the ambient atmosphere via a hose 50. Connection to the ambient atmosphere ensures an immediate release of even lightweight electronic workpieces, since no vacuum residue is allowed to remain in the dead space of the chamber 22 upon interruption of the path from the vacuum tip to the pumps. The position of a depressible button 52 connected to a valve stem 54 determines the vacuum pressure at the chamber 22. While the button 52 will be described as being connected to the valve stem 54, typically the button and valve stem are a single-piece structure. The method of manufacturing and/or attaching the button and valve stem are not critical.

Figure 3:
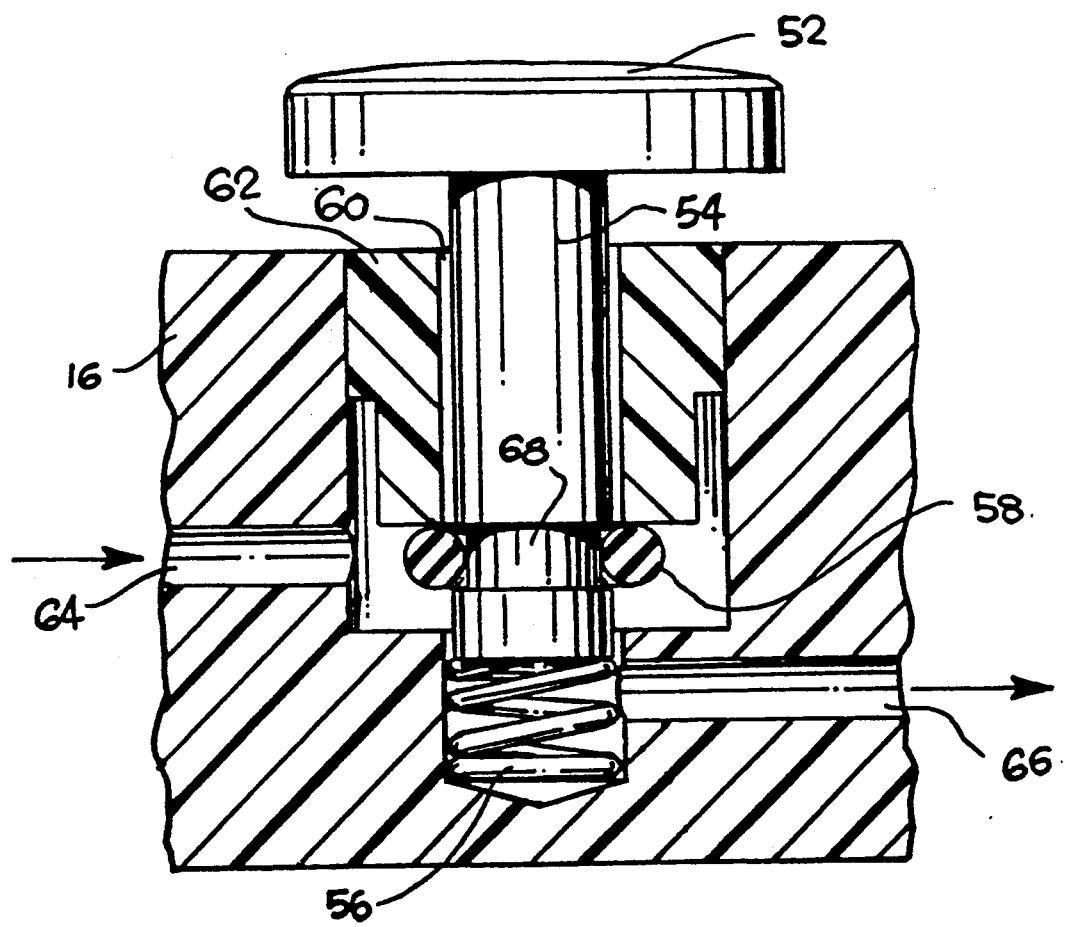
FIG. 3 is a side sectional view of the valve of FIG. 2.

The three-way valve 46 is typically a normally open mechanism. That is, operating vacuum is available at the vacuum tip 12 unless valve stem 54 is depressed. One embodiment of such a valve is shown in FIG. 3, but other valving mechanisms are available. A coil spring 56 presses the valve stem 54 into a raised position. In this position, an o-rinq 58 acts to seal a passageway 60 between a cap 62 and the valve stem. The passageway 60 leads to the ambient atmosphere, but the position of the o-ring prevents fluid communication between the ambient atmosphere and an inlet passageway 64 leading to the vacuum tip. Instead, the inlet passageway to the vacuum tip is in fluid communication with an outlet passageway 66 to the pumps to create a vacuum pressure at the inlet passageway 64. Exerting pressure on the button 52 forces the valve stem 54 downwardly. Because the o-ring is mounted within a reduced-diameter portion 68 of the valve stem, the o-ring is moved from blocking engagement with the cap 62, allowing a free flow of air from the inlet passageway 64 to the passageway 60 to the ambient atmosphere. Full depression of the button lowers the o-ring into a sealing relationship with the body 16 to block airflow from the inlet passageway 64 to the outlet passageway 66.

While FIG. 2 illustrates the path to the ambient atmosphere as being through a hose 50, FIG. 3 shows that the passageway is actually along the valve stem 54. Consequently, unlike conventional prior art valving assemblies in which the valve stem slides along surrounding structure that is only slightly greater in diameter, here the valve stem is allowed to freely move in a manner that does not generate particulate contamination.

In operation, the flow path from an inlet of the handling tool 10 to an outlet is from the vacuum tip 12 shown in FIG. 2 to the three-way valve 46 and then to the serially connected pumps 40 and 42. The pumps are connected to a filter 70 by a hose 72 for use in a fabrication cleanroom environment. The filter 70 should be a submicron filter. From the filter 70 the air is released into the ambient atmosphere by an outlet hose 74. Alternatively, the filter 70 may be mounted to the wall of the body 16 in order to eliminate the outlet hose 74.

The body 16 is divided into two chambers 76 and 78 by a wall 80. The wall 80 is not comparable to the division of the handling tool 10 into a base portion 82 and a handle portion 84 as shown in FIG. 1. Rather, the internal wall 80 provides an airtight isolation of the motors 36 and 38. Conventional motors include bushings that generate particles which would be detrimental to a fabrication cleanroom. An airtight isolation of the motors and the pumps 40 and 42 ensures that any generated particulate contamination remains within the body 16. Grommets 86 and 88 are utilized to allow passage of the hoses 48 and 72 through the internal wall 80. Preferably, grommets are also used for electrical lines that pass between the chambers 76 and 78.

Particle generation is also retarded by exhausting the handling tool 10 into the ambient atmosphere, as shown by outlet hose 74. An exhaust into the body 16 would disturb particles collected during the manufacture of a tool.

Figure 4:
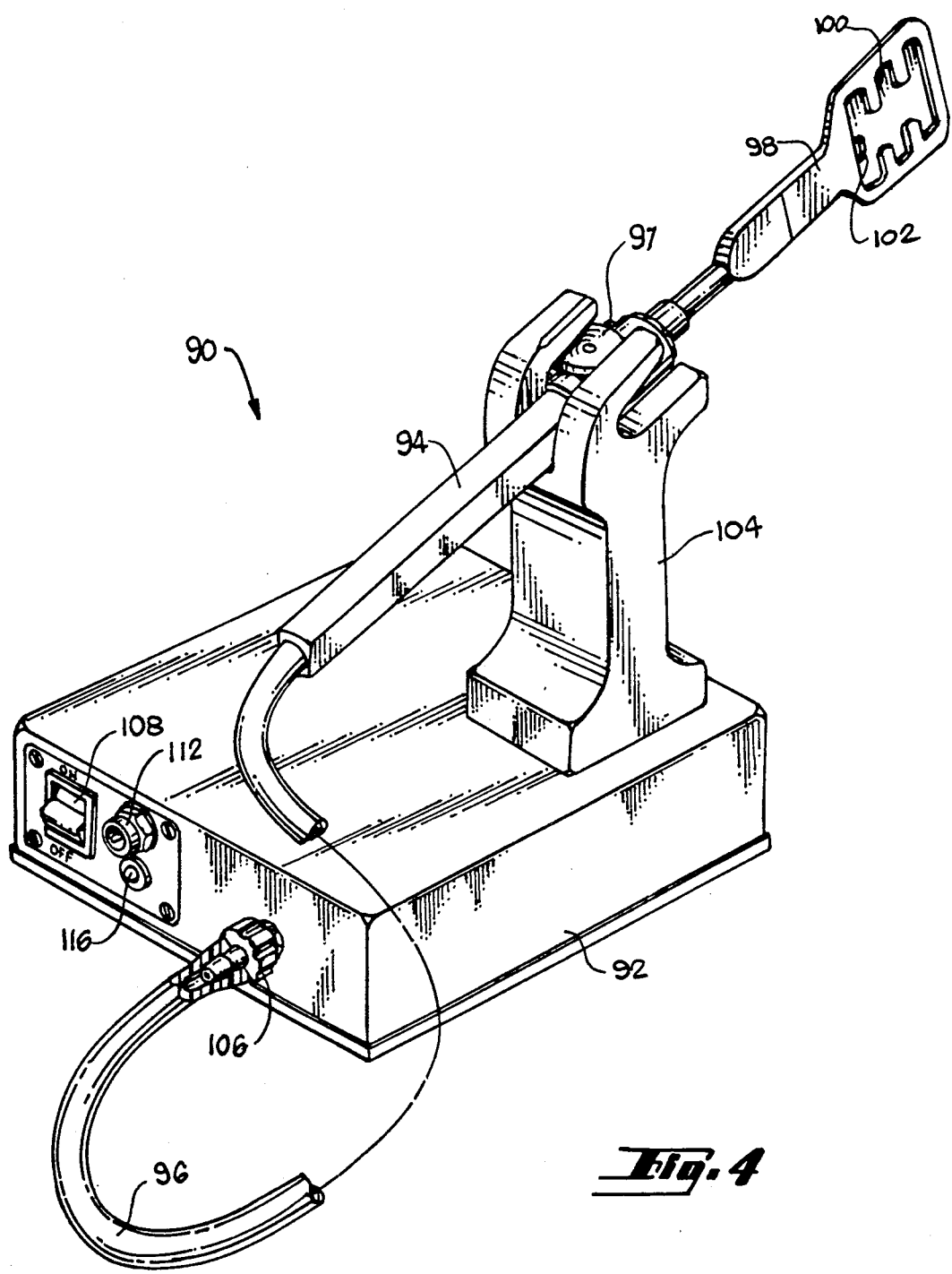
FIG. 4 is a perspective view of a second embodiment of the handling tool of the present invention.

A second embodiment of the present invention is shown in FIG. 4. The serial connection of two or more vacuum pumps is employed as described above, but rather than a stand-alone tool, the tool 90 of FIG. 4 includes a base 92 connected to a wand handle 94 by a hose 96. The wand handle may be of any type known in the art. The wand handle includes a valve mechanism 97. Preferably, the valve mechanism is a three-way valve as described above. A vacuum tip 98 is identical to the one described above, having a vacuum chamber 100 and an inlet 102. A wand holder 104 is fixed to the base 92 and positions the wand handle when not in use.

The hose 96 is press fit to a fitting 106 that is the inlet to the base 92. The inlet connects to two or more serially connected vacuum pumps. A switch 108 is used to couple a battery pack to the vacuum pumps. A power lamp 116 illuminates when the pumps have been activated. An electrical jack 112 is used during recharging of battery pack.

The two-piece tool of FIG. 4 may be used for applications in which an operator will remain in the same general area, while the stand-alone tool 10 of FIG. 1 is more suited for applications in which an operator must move greater distances or must be concerned with ensuring that an attachment hose does not limit maneuverability. A third embodiment which is not shown would be one which secures an attachment to the base portion 82 of FIG. 1 or the base 92 of FIG. 4 for coupling the base to a belt or the like of the operator, while the handle portion of the tool is held by the operator.

We claim:

1. A portable battery-powered tool for handling electronic workpieces comprising,
   a portable body,
   a first vacuum source contained within said portable body, said first vacuum source having an inlet and an outlet,
   a second vacuum source contained within said portable body, said second vacuum source having an outlet and having an inlet in fluid connection with said outlet of said first vacuum source, said first and second vacuum sources being air tightly sealed within said portable body other than at said inlet of said first vacuum source and said outlet of said second vacuum source,
   means coupled to said inlet of said first vacuum source for applying vacuum pressure to an electronic workpiece to be picked up,
   valve means connected to said inlet of said first vacuum source for selectively interrupting fluid flow to said first vacuum source, and
   battery means attached to said portable body for powering said first and second vacuum sources,
   whereby said vacuum pressure applied to said electronic workpiece is determined by a serial connection of said first and second vacuum sources.

2. The tool of claim 1 wherein said first and second vacuum sources include vacuum pumps coupled in serial fashion.

3. The tool of claim 2 wherein said vacuum pumps provide a combined vacuum pressure exceeding 21 inches of mercury.

4. The tool of claim 1 wherein said means for applying vacuum pressure includes a wand member attached to said portable body by a hose, said valve means being fixed to said wand member.

5. The tool of claim 1 wherein said outlet of said second vacuum source is channeled to the atmosphere about said portable body by a hose, said tool further comprising a filter means for removing particle matter prior to release of air from said second vacuum source into said atmosphere.

6. The tool of claim 1 wherein said battery means is a rechargeable battery pack.

7. The tool of claim 1 wherein said means for applying vacuum pressure is a vacuum tip mounted to said portable body.

8. A stand-alone tool for handling electronic workpiece comprising,
   a portable body having an inlet port and an outlet port,
   a vacuum tip mounted on said portable body in fluid communication with said inlet port, said vacuum tip having an opening at a workpiece contacting region of said vacuum tip,
   a first vacuum pump means for generating a pressure differential between said inlet port and said outlet port, said first vacuum pump means being within said portable body,
   a second vacuum pump means within said portable body for generating a pressure differential between said inlet and outlet ports, said first and second vacuum pump means being in serial connection with respect to fluid flow from said inlet port to said outlet port,
   a filter immediately upstream of said outlet port to remove particles from a pressurized flow from said second vacuum pump means,
   a valve mounted on said portable body in fluid connection with said inlet port, said valve having a vacuum-release position and a workpiece-pickup position, and
   battery means for providing power to said first and second vacuum pump means.

9. The tool of claim 8 wherein said second vacuum pump means has a direct flow path to said filter, said tool including a direct flow path from said filter to said outlet port.

10. The tool of claim 8 wherein said valve includes a vent from the ambient atmosphere to said vacuum tip when said valve is in said vacuum-release position.

11. The tool of claim 8 wherein said battery means is a rechargeable battery pack.

12. A tool for handling electronic workpieces comprising,
    pickup means for applying vacuum pressure to an electronic workpiece,
    a portable body having first and second chambers, said first chamber having an inlet in fluid communication with said pickup means,
    a valve mounted to said portable body downstream of said inlet for regulating flow of air from said pickup means, a first vacuum pump housed within said second chamber and connected to said valve, a second vacuum pump housed within said second chamber and connected downstream of said first vacuum pump, said second vacuum pump having an exhaust, means for filtering submicron particles from said exhaust of said second vacuum pump to release a filtered stream of air directly into the ambient atmosphere, and battery means mounted to said portable body for energizing said first and second vacuum pumps, wherein said second chamber is air tightly sealed from the ambient atmosphere and from said first chamber other than at fluid communication of said first and second vacuum pumps with said inlet and with release of said exhaust directly into the ambient atmosphere.

13. The tool of claim 12 wherein said pickup means is a vacuum tip mounted to said portable body at said inlet.

14. The tool of claim 12 wherein said pickup means is a wand handle having a vacuum tip.

* * * * *

UNITED STATES PATENT AND TRADEMARK OFFICE
CERTIFICATE OF CORRECTION

PATENT NO. : 5,217,273
DATED : June 8, 1993
INVENTOR(S) : Howard W. Hendricsen et al.

It is certified that error appears in the above-indentified patent and that said Letters Patent is hereby corrected as shown below:

Column 2, line 53, "to the atmosphere" should read
 - -to the ambient atmosphere- -;
 line 62, "so body" should read - -so that the body- -;
 line 63, "a hose connects wand member" should read
 - -a hose connects the base to a wand member- -.

Column 3, lines 2-3, "The tools designed for attachment"
 should read - -The tool is therefore able to perform
 all of the duties of tools designed for attachment- -;
 lines 5-6, "the tool has been to minimize" should read
 - -the tool has been designed to minimize- -;
 line 24, "Depending upon workpiece" should read
 - -Depending upon the electronic workpiece- -.

Column 4, line 2, "The valve 16" should read
 - -The valve 46- -.

Signed and Sealed this

Eighth Day of February, 1994

Attest:

BRUCE LEHMAN

Attesting Officer     Commissioner of Patents and Trademarks